United States Patent

Yamamoto

[11] Patent Number: 6,133,122
[45] Date of Patent: Oct. 17, 2000

[54] METHOD OF FABRICATING SEMICONDUCTOR DEVICE FOR PREVENTING RISING-UP OF SILISIDE

[75] Inventor: Yoshiaki Yamamoto, Tokyo, Japan

[73] Assignee: NEC Corporation, Tokyo, Japan

[21] Appl. No.: 09/089,666

[22] Filed: Jun. 3, 1998

[30] Foreign Application Priority Data

Jun. 6, 1997 [JP] Japan .................................. 9-149733

[51] Int. Cl.⁷ ................................................ H01L 21/425
[52] U.S. Cl. ..................... 438/514; 438/522; 438/533; 438/303; 438/305; 438/585; 438/648
[58] Field of Search .................................. 438/231, 660, 438/230, 305, 303, 522, 532

[56] References Cited

U.S. PATENT DOCUMENTS

| | | |
|---|---|---|
| 4,047,976 | 9/1977 | Bledsoe et al. . |
| 4,855,798 | 8/1989 | Imamura et al. . |
| 5,185,294 | 2/1993 | Lam et al. . |
| 5,380,677 | 1/1995 | Eakin . |
| 5,393,685 | 2/1995 | Yoo et al. . |
| 5,434,096 | 7/1995 | Chu et al. . |
| 5,460,993 | 10/1995 | Hsu et al. . |
| 5,527,718 | 6/1996 | Seita et al. . |
| 5,599,726 | 2/1997 | Pan . |
| 5,665,646 | 9/1997 | Kitano . |
| 5,698,468 | 12/1997 | Kapoor . |
| 5,707,896 | 1/1998 | Chaing et al. . |
| 5,739,046 | 4/1998 | Lur et al. . |
| 5,811,343 | 9/1998 | Wann et al. . |
| 5,834,346 | 10/1998 | Sun et al. . |

FOREIGN PATENT DOCUMENTS

| | | |
|---|---|---|
| 59-126672 | 7/1984 | Japan . |
| 61-150216 | 7/1986 | Japan . |
| 4-11776 | 1/1992 | Japan . |
| 7-249763 | 9/1995 | Japan . |

OTHER PUBLICATIONS

Wolf, Silicon processing for the VLSI Era vol. 2, pp. 144–147, 1990.

*Primary Examiner*—John F. Niebling
*Assistant Examiner*—Jonathan Hack
*Attorney, Agent, or Firm*—Young & Thompson

[57] ABSTRACT

Disclosed is a manufacturing method of a semiconductor device which comprises which comprises an element isolation region formation step; a side wall formation step; a diffusion layer formation step; an activation step; a silicide formation step; and a removing step. The element isolation region formation step is the one for forming a field oxide film on a semiconductor substrate to form an element isolation region. In order to form a diffusion layer by introducing impurities into the semiconductor substrate, after injecting the fluorides (ion injection species) of elements into the semiconductor substrate, a thermal treatment is performed at a lower temperature than that of a thermal treatment for activating the diffusion layer prior to the activation of the diffusion layer, and fluorine produced from the ion injection species is discharged to the outside.

21 Claims, 9 Drawing Sheets

RELATION BETWEEN FLUORINE CONCENTRATION
AND PROPORTION DEFECTIVE DUE TO RISING-UP

Fig.7

METHOD OF FABRICATING SEMICONDUCTOR DEVICE FOR PREVENTING RISING-UP OF SILISIDE

BACKGROUND OF THE INVENTION

Field of the Invention

The present invention relates to a method of fabricating a semiconductor device, more particularly to a method of fabricating a semiconductor device for preventing rising-up of siliside.

A high integration of semiconductor integrated circuits such as LSI has developed micronizing of devices. For example, impurity diffusion layers in source and drain regions are formed to be shallow and areas of them are made small. Moreover, a width of wirings connecting the devices are also narrowed. For this reason, electric resistances of the diffusion layers and the wirings are increased, so that a high speed operation of the devices is obstructed. From such circumstances, in the recent semiconductor devices, the attempt is made to form the surface of the impurity diffusion layer by using high melting point metal silicides, particularly by titanium silicide, whereby a high speed operation of the devices can be achieved by an decrease in the resistance of the impurity diffusion layer.

For the formation of the titanium silicide layer, U.S. Pat. No. 4,855,798 discloses the formation of the titanium silcide layer using a self-alignment manner. The method to form the titanium silicide layer in the self-alignment manner will be described with reference to FIGS. 3(a) to 3(g).

Figure 3A:
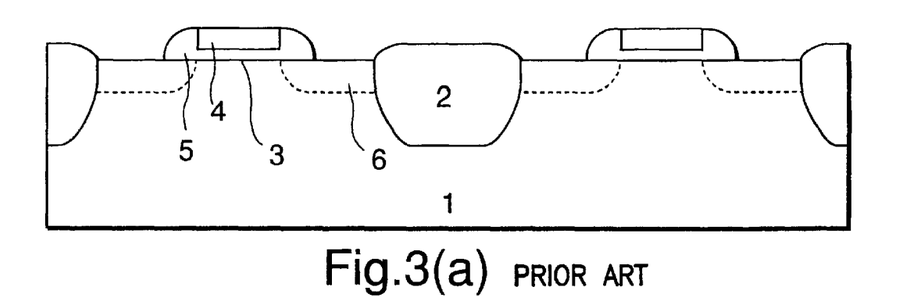
FIGS. 3(a) to 3(g) are a schematic section views showing a sequence of steps of an example of a conventional Ti silicide formation method.

As shown in FIG. 3(a), the field oxide film 2, the gate oxide film 3, the gate electrode 4 and the side wall film 5 are formed on the semiconductor substrate 1. The exposed portions 6 of the semiconductor substrate 1 act as a diffusion layer region after impurity ions are injected thereto.

Figure 3B:
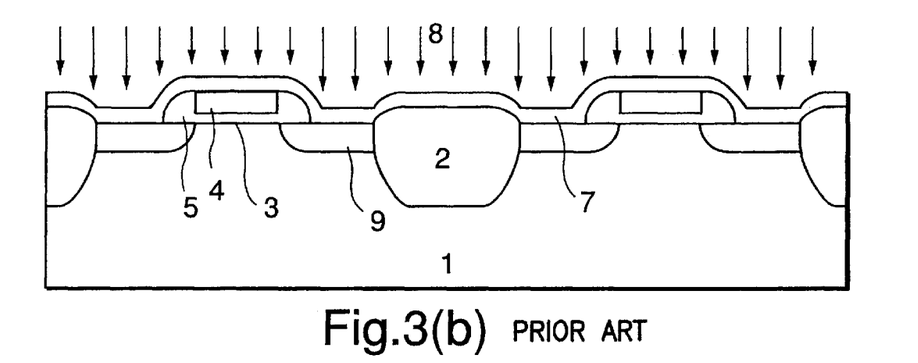

Next, a protection oxide film 7 for the ion injection is formed on the entire surface of the resultant structure using a CVD method, for example, and thereafter impurity ions 8 are injected, thereby forming the diffusion layer 9 (FIG. 3(b)). Subsequently, a thermal treatment at a temperature of not less than 900° C. is performed to activate the diffusion layer 9. That is, the activated diffusion layer 14 is formed.

Figure 3C:
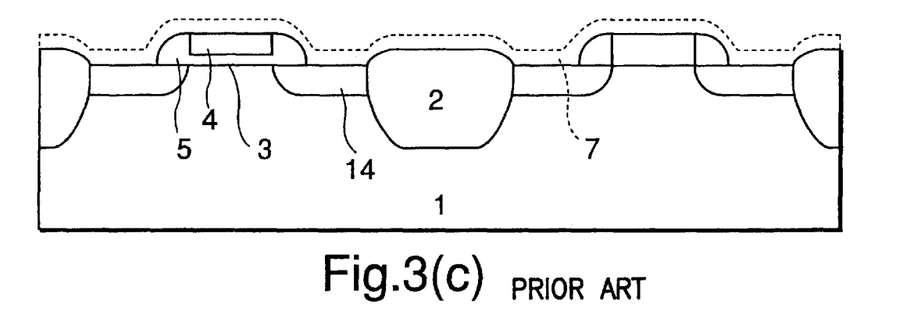

Thereafter, the protection oxide film 7 is removed, and further a natural oxide film is removed prior to a Ti sputtering (FIG. 3(c)).

Figure 3D:
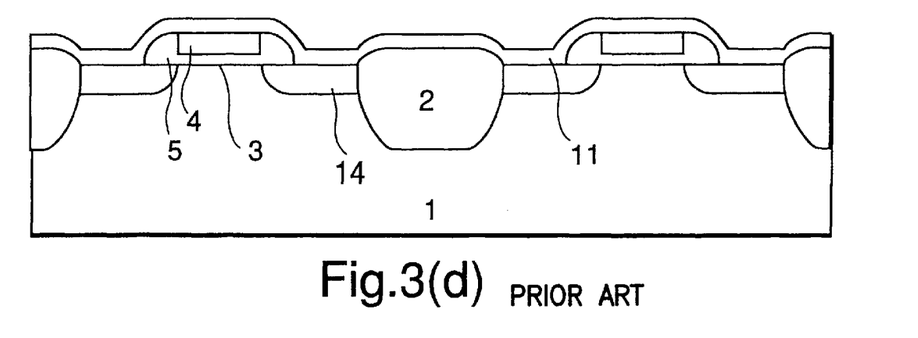
Figure 3E:
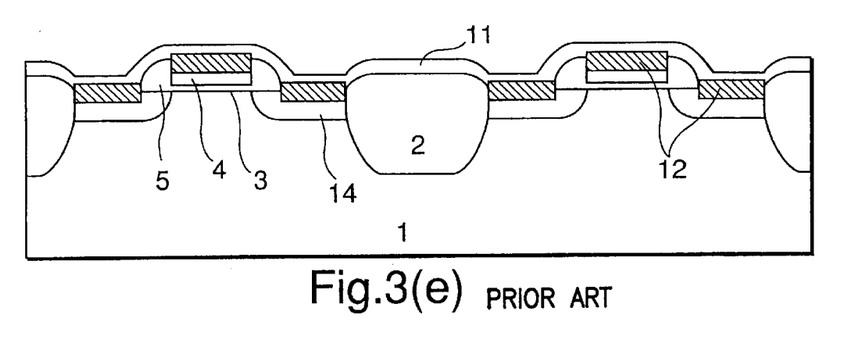

Next, as shown in FIG. 3(d), the titanium film 11 is grown on the entire surface of the resultant structure by a sputtering method, for example. The titanium silicide film 11 is subjected to a thermal treatment under the conditions that a temperature is not more than 700° C. in an inert gas atmosphere, for example, a nitrogen atmosphere. Thus, the titanium silicide layer 12 of C49 phase is formed of high resistance TiSi$_2$ (a first sinter). At this time, the titanium silicide layer 12 only on the gate electrode 4 and the activated diffusion layer 14 in a self-aligned manner FIG. 3(e).

Figure 3F:
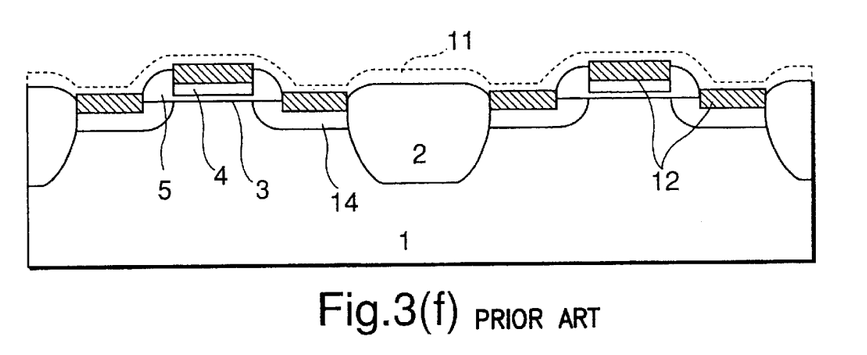
Figure 3G:
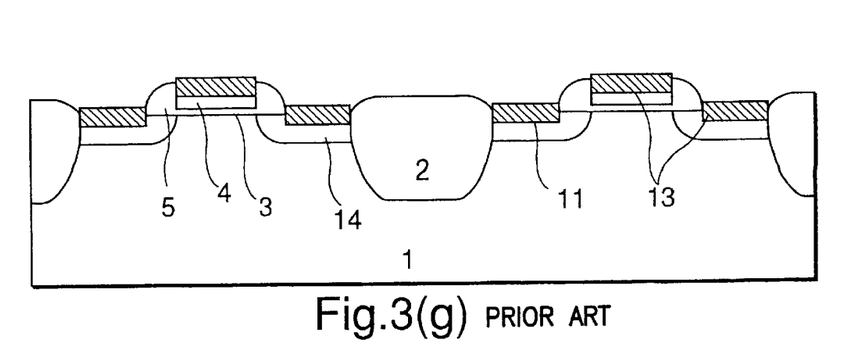

Subsequently, the non-reacted titanium film 11 on the field oxide film 2 and the side wall film 5 is removed (FIG. 3(f)). Furthermore, a thermal treatment at a temperature of not less than 800° C. is performed. As a result of the thermal treatment, the titanium silicide film of C54 phase formed of low resistance TiSi$_2$ as shown in FIG. 3(g) is formed (a second sinter).

However, when the titanium silicide films are formed by the foregoing method, the development of micronizing of the devices has created the problems of an electrical short-circuit between the gate electrode and the diffusion layers acting as the source/drain regions and between the diffusion layers adjacent to each other. The electrical short-circuits inherently originate from rising-up of the titanium silicide onto the region where the titanium silicide is not formed, that is, onto the side wall film for separating the gate electrode and the diffusion layers and onto the field oxide film for separating the diffusion layers. Hereinafter, such phenomenon is referred to as "a rising-up". Alternately, the electrical short-circuits originate from the formation of the conductive material. In order to prevent the rising-up of the titanium silicide and the formation of the conductive material, lengthening of an etching time to etch the non-reactive titanium silicide causes the titanium silicide on the diffusion layer to be etched excessively, leading to condition wherein the diffusion layer resistance increases.

From such viewpoint, several methods to prevent the rising-up due to the expansion of the titanium silicide into the undesired regions have been proposed.

One of them is disclosed in Japanese Patent Laid Open No. Sho 61-150216. In this method, a titanium film is formed on a silicon substrate. Thereafter, the first sinter is performed at a comparatively low temperature of 400 to 600° C., whereby the titanium film is converted to a titanium silicide film by so-called siliciding reaction. A non-reactive titanium film is removed, thereby forming a high resistance titanium silicide film on diffusion layers and a gate electrode. Thereafter, the second sinter is performed at a temperature not less than 800° C., thereby converting the high resistance titanium silicide film to a low resistance titanium silicide film. Because the first sinter is performed at the comparatively low temperature of 400 to 600° C., this method has a feature in that the rising-up of the titanium silicide film can be prevented.

Figure 4:
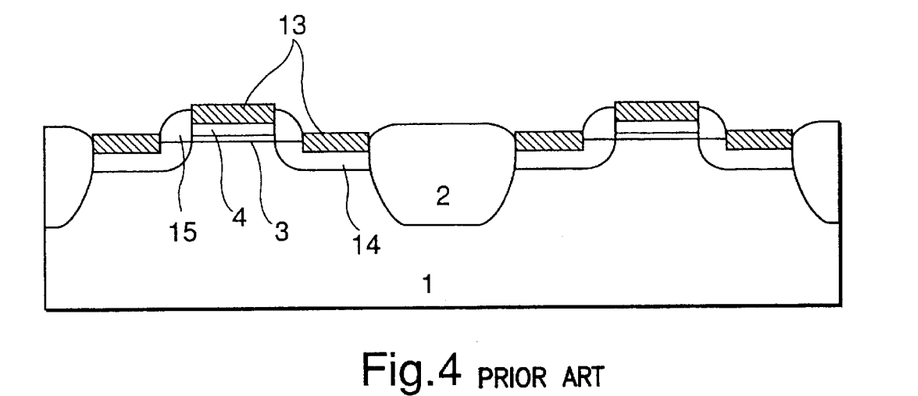
FIG. 4 is an example of a section structure after the formation of the Ti silicide in the conventional technology.

Another method is disclosed in Japanese Patent Laid Open No. Sho 59-126672. The structure of the semiconductor device manufactured by this method is shown in FIG. 4. In this method, in order to suppress the rising-up of the titanium silicide film on the side wall film and the reaction of the titanium film with the side wall film, the side wall film is formed of SiN film which is not prone to react with the titanium film.

However, the above-described methods have posed the following new problems.

The firstly described method involves the problem that with the micronizing of the diffusion layers and the gate electrode, a desired resistance can not be obtained. The reason is that because the first sinter temperature is low, the resistance of the titanium silicide is high, and the layer resistance of the diffusion layer after the second sinter is not below a desired value. In order to obtain the diffusion layer resistance below the desired value, if the second sinter temperature is increased, the problem that the titanium silicide is condensed occurs. For this reason, under the low first sinter temperature, the low resistance of the diffusion layer can not be achieved even when the rising-up of the titanium silicide can be suppressed.

In the secondly described method, though the electrical short-circuit between the gate electrode and the diffusion layer can be suppressed, it is impossible to suppress the electrical short-circuit between the diffusion layers adjacent to each other.

As described above, the electrical short-circuits between the gate electrode and the diffusion layer and between the diffusion layers adjacent to each other can not be necessarily perfectly suppressed with the conventional technologies.

Figure 5A:
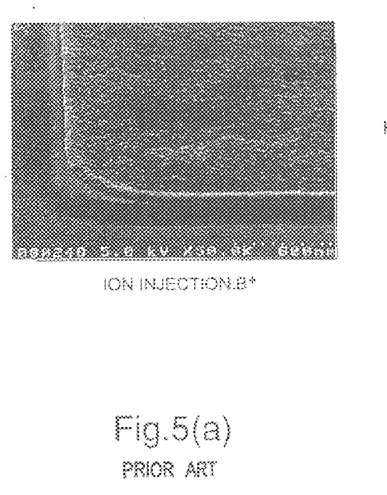
Figure 5B:
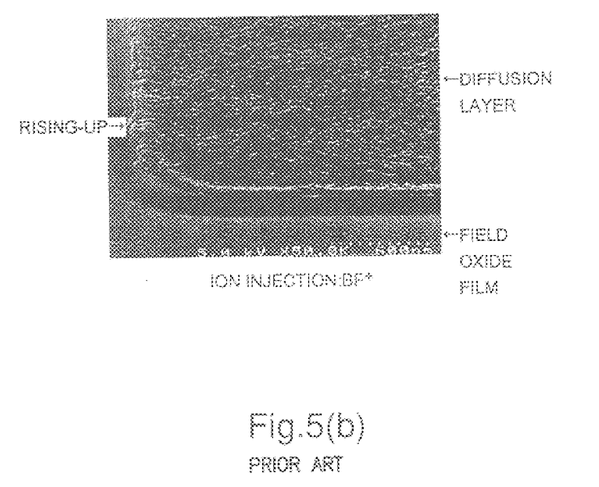

In order to suppress such an electrical short-circuit perfectly, factors causing the rising-up of the titanium silicide were investigated. The rising-up of the Ti silicide is more significant in the P-type diffusion layer, so that attention was paid to P-type ion injection species. For the P-type diffusion layer to which $BF^{2+}$ (mass:49) is injected as the ion injection species, the rising-up of the Ti silicide is shown in FIG. 5b. On the other hand, for the P-type diffusion layer to which $B^+$ (mass:11) is injected as the ion injection species, no rising-up is shown in FIG. 5a. From this fact, it was proved that F in the $BF^{2+}$ (mass: 49) that is the P-type ion injection species remains in the field oxide film and the side wall film, and a Ti silicide reaction inductively occurs on the field oxide film and the side wall film during performing the Ti silicide reaction, thereby creating the rising-up of the Ti silicide.

If the P-type diffusion layer is formed using $B^+$ mass: 11) as the ion injection species, the rising-up of the Ti silicide can be suppressed. However, it is impossible to form shallow diffusion layers, so that micronizing of the semiconductor integrated circuit can not be achieved with the use of $B^+$ (mass:11) as the ion injection species.

SUMMARY OF THE INVENTION

From the viewpoint of the above described circumstances, the object of the present invention is to provide a formation method of a Ti silicide applied to manufacturing of semiconductor devices, more particularly to a method for forming good quality products stably without producing defective products due to an electrical short-circuit between a gate electrode and a diffusion layer and between diffusion layers adjacent to each other.

The method of the present invention was proposed in order to achieve the above-described object.

A method of fabricating a semiconductor device comprising, forming an isolation region around a predetermined area of a semiconductor substrate, selectively forming an insulating layer on said predetermined area, selectively forming an electrode on said insulating layer, injecting an impurity ion in said substrate which is between said electrode and said isolation region, applying heat of a first temperature to said substrate, and applying heat of a second temperature higher than said first temperature to said substrate for activating said impurity ion after applying heat of said first temperature.

The method of the present invention is featured in a low temperature thermal treatment carried out between the ion injection step forming the diffusion layer and the activation of the diffusion layer, thereby discharging fluorine produced from the ion injection species to the outside from a surface of the insulating film, a surface of the side wall, the silicon semiconductor substrate, and an interface between the semiconductor substrate and the isolation region. The low temperature thermal treatment is preferably carried out prior to the activation step consecutively in the same apparatus.

An operation of the present invention will be described with an example using an ion injection species which includes fluorine.

The method of the present invention has a feature that the step for removing fluorine injected into the surface of the field oxide film, the surface of the side wall film, the semiconductor substrate, the interface between the semiconductor substrate and the field oxide film. The reason why fluorine is removed as follows. Because of the formation of the P-type diffusion layer, fluorine injected into the field oxide film, the side wall film and the semiconductor substrate induces during the first sinter of the Ti silicide formation step, the rising-up of the Ti silicide on the portions of the field oxide film and side wall film where the Ti silicide should not be formed. When the rising-up of the Ti silicide occurs, electrical short-circuits between the gate electrode and the diffusion layer and between the diffusion layers adjacent to each other are caused. Therefore, this method of manufacturing a semiconductor device is intended to suppress the rising-up of the Ti silicide by removing fluorine.

In order to remove fluorine, the low temperature thermal treatment is carried out prior to the step for activating the diffusion layer. Removing the fluorine enables stable obtainment of good quality products free from the rising-up of the Ti silicide, without producing defective products due to an electrical short-circuit.

BRIEF DESCRIPTION OF THE DRAWINGS

For a more complete understanding of the present invention and the advantages thereof, reference is now made to the following description taken in conjunction with the accompanying drawings, in which;

FIGS. 5(a) and 5(b) are a SEM photograph of the semiconductor device which has the conventional configuration shown in FIG. 4, when viewed from an obliquely above direction, specifically, FIGS. 5(a) and 5(b) show a micro-pattern formed on a semiconductor substrate, which shows a state of a rising-up of a Ti silicide, and which show that the degree of the rising-up differs depending on an injection species injected, and FIG. 5(a) shows the case where $B^+$ (mass:11) is used and FIG. 5(b) shows the case where $BF^{2+}$ (mass:49) is used.

DETAILED DESCRIPTION OF THE PREFERRED EMBODIMENTS

Embodiments of the present invention will be described with reference to the accompanying drawings.

The first embodiment is described with reference to FIGS. 1(a) to 1(h).

Figure 1A:
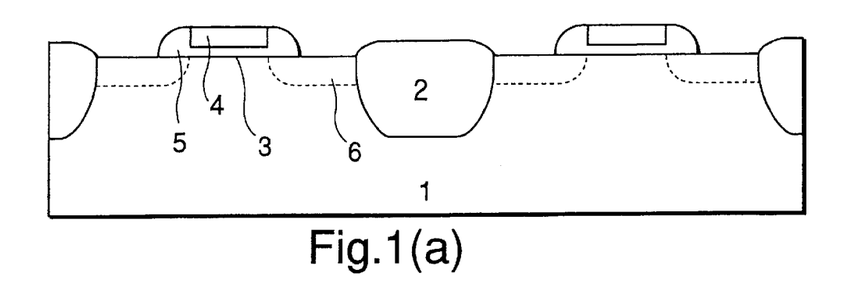
FIGS. 1(a) to 1(h) are a schematic section view showing a first application example of a Ti silicide formation method of first and second embodiments, according to a sequence of steps thereof.
Figure 1B:
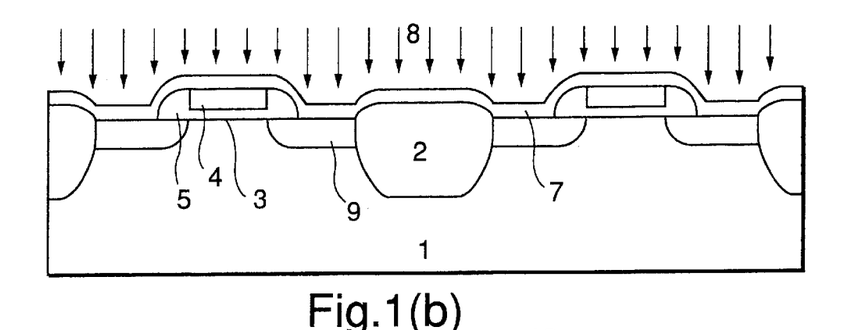

As shown in FIG. 1(a), the field oxide film 2, the gate oxide film 3, the gate electrode 4 and the side wall film 5 are formed on the silicon substrate 1.

Figure 6:
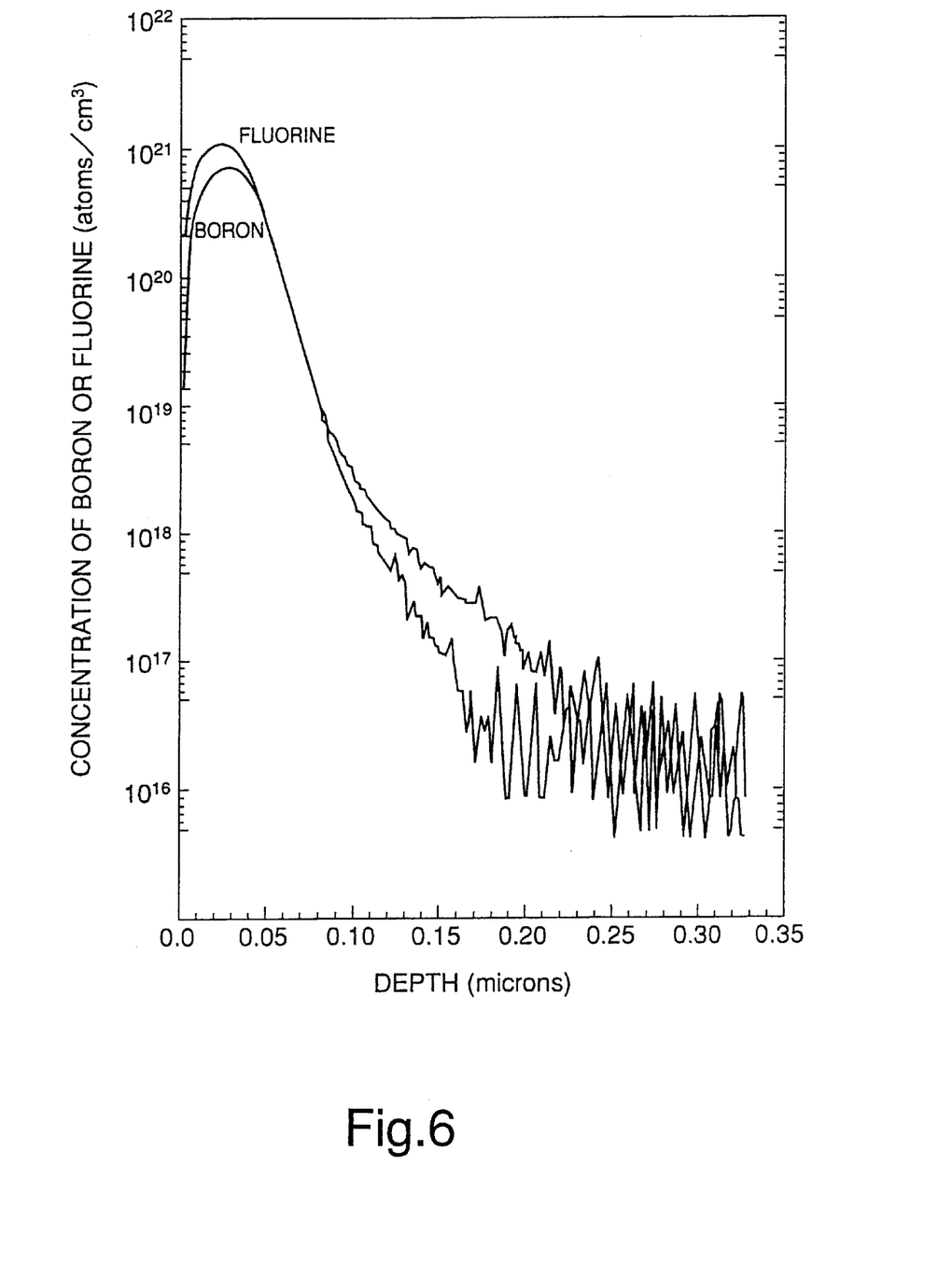
FIG. 6 is a graph showing a depth profile of concentrations of boron and fluorine in $BF^{2+}$ (mass:49) that is a P-type ion injection species of the present invention.

Subsequently, a protection oxide film 7 for an ion injection is formed on the entire surface of the resultant structure using a CVD method. Thereafter, the impurity ions 8 are injected into the exposed portions of the silicon substrate 6, thereby forming the diffusion layer 9 FIG. 1(b)). Here, the description is made for formation of a P-type diffusion layer. As P-type impurities, $BF^{2+}$ (mass: 49) ions capable of forming a shallow junction are injected into the entire surface of the resultant structure of FIG. 1(a), under the conditions that an acceleration voltage is 30 KeV and an impurity concentration is 3E15 $cm^{-2}$. At this time, the depth profile of concentrations of boron and fluorine that are component elements of the ion injection species is determined depending on injection energy, in which B exhibits the maximum concentration at about 30 nm and F exhibits it near about 25 nm, as shown in FIG. 6.

Figure 1C:
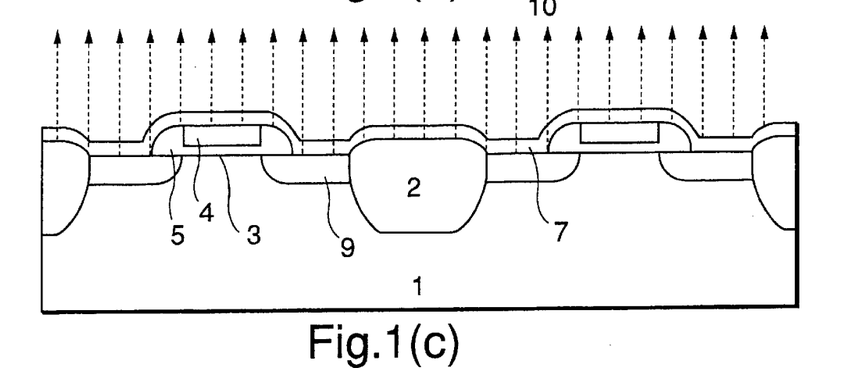

Next, a thermal treatment is performed in a nitrogen gas atmosphere using a diffusion furnace, under the conditions that a temperature is 700° C. and a treatment time is 60 minutes (FIG. 1(c)). During the thermal treatment, F (fluorine) 10 existing in the field oxide film 2, the side wall film 5, the diffusion layer 9 and the interface between silicon substrate 1 and the field oxide film 2 are discharged as an out gas. Hence, the F concentrations in the field oxide film 2, the side wall film 5, the silicon substrate 1 and the interface between the diffusion layer 9 and the field oxide film 2 become 1E20 atom/$cm^3$ or less.

Subsequently, a thermal treatment at a temperature of 1000° C. for 10 seconds is performed using a lamp annealing apparatus, thereby activating the diffusion layer. That is, the activated diffusion layer 14 is formed. Here, if a low temperature thermal treatment is performed after the activation of the diffusion layer 14, F will combine with Si and the like, disenabling an annealing-out of the fluorine. Therefore, the low temperature thermal treatment should be effectively performed prior to the thermal treatment for activating the diffusion layer.

Figure 1D:
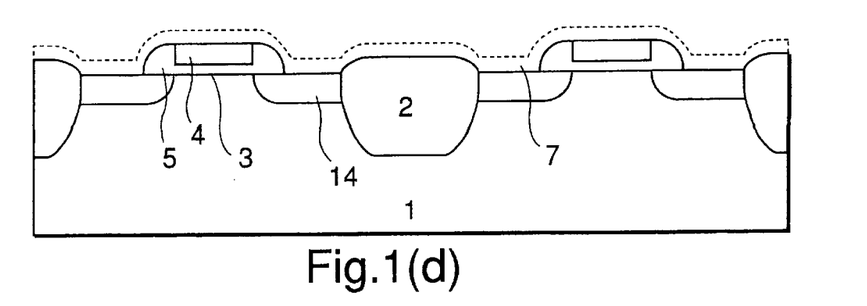

Thereafter, the protection oxide film 7 is removed using a RIE etching apparatus and natural oxide films formed on the diffusion layer and the gate electrode are removed using 1:100 DHF liquid, prior to a Ti sputtering FIG. 1(d)).

Figure 1E:
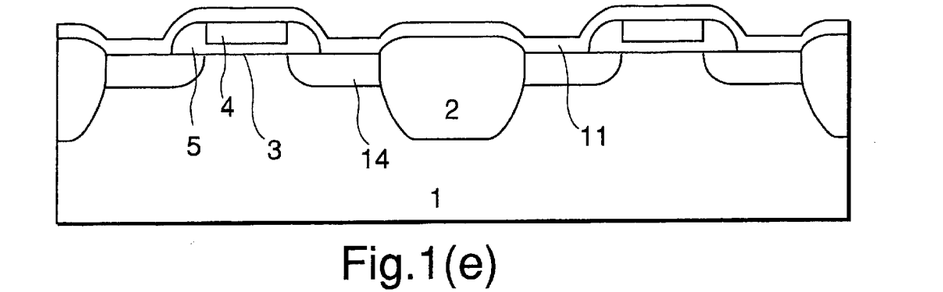
Figure 1F:
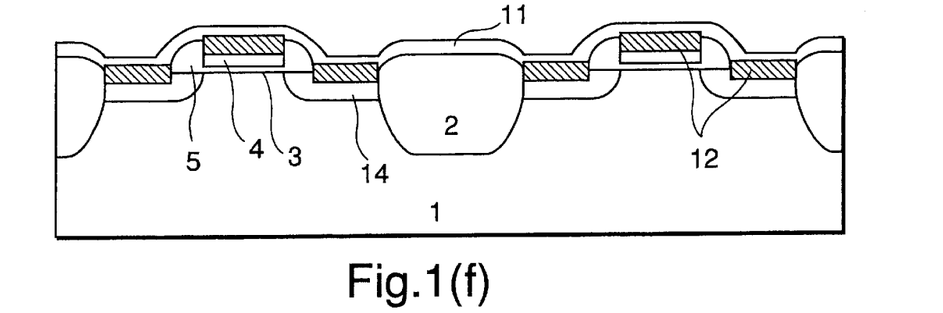

Next, as shown in FIG. 1(e), the Ti film 11 is formed to a thickness of 30 nm on the entire surface of the resultant structure by sputtering. A thermal treatment at a temperature of 700° C. for 30 seconds is performed using a lamp annealing apparatus, thereby forming the Ti silicide layer 12 of C49 phase formed of high resistance $TiSi_2$ (a first sinter) (FIG. 1(f)). At this time, the Ti silicide layer 12 is formed only on the gate electrode 3 and the diffusion layer 9 in a self-aligned manner.

Figure 1G:
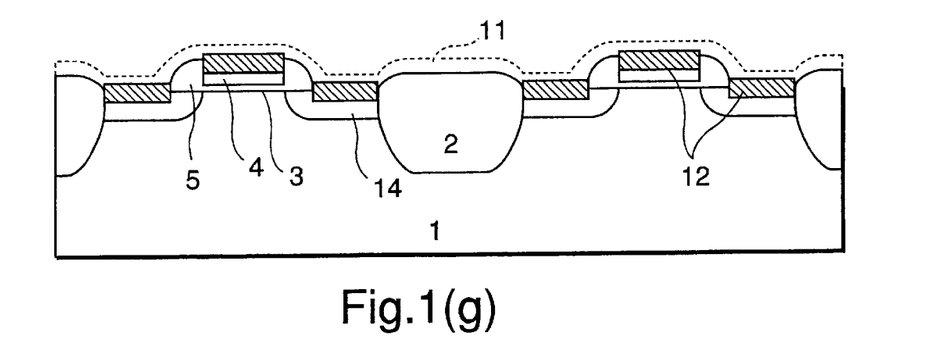

Then, the non-reactive portions of the Ti film 11 on the field oxide film 2 and the side wall film 5 are removed using an aqueous per-ammonium solution (FIG. 1(g)).

Figure 1H:
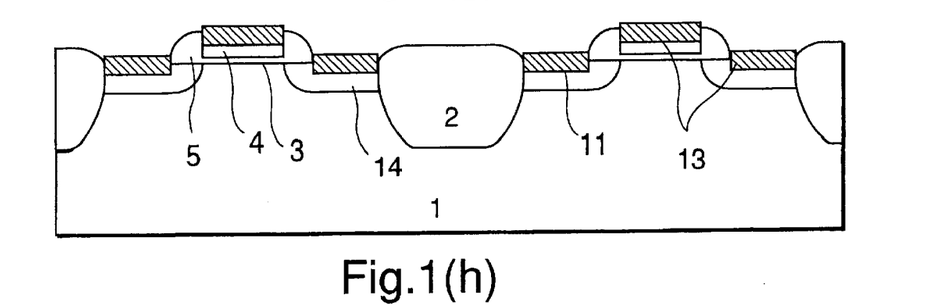

Thereafter, a thermal treatment at a temperature of 850° C. for 10 seconds is further performed using a lamp annealing apparatus. As a result, the Ti silicide layer 13 of C54 phase formed of a low resistance $TiSi_2$ as shown in FIG. 1(h) is formed (a second sinter).

Figure 7:
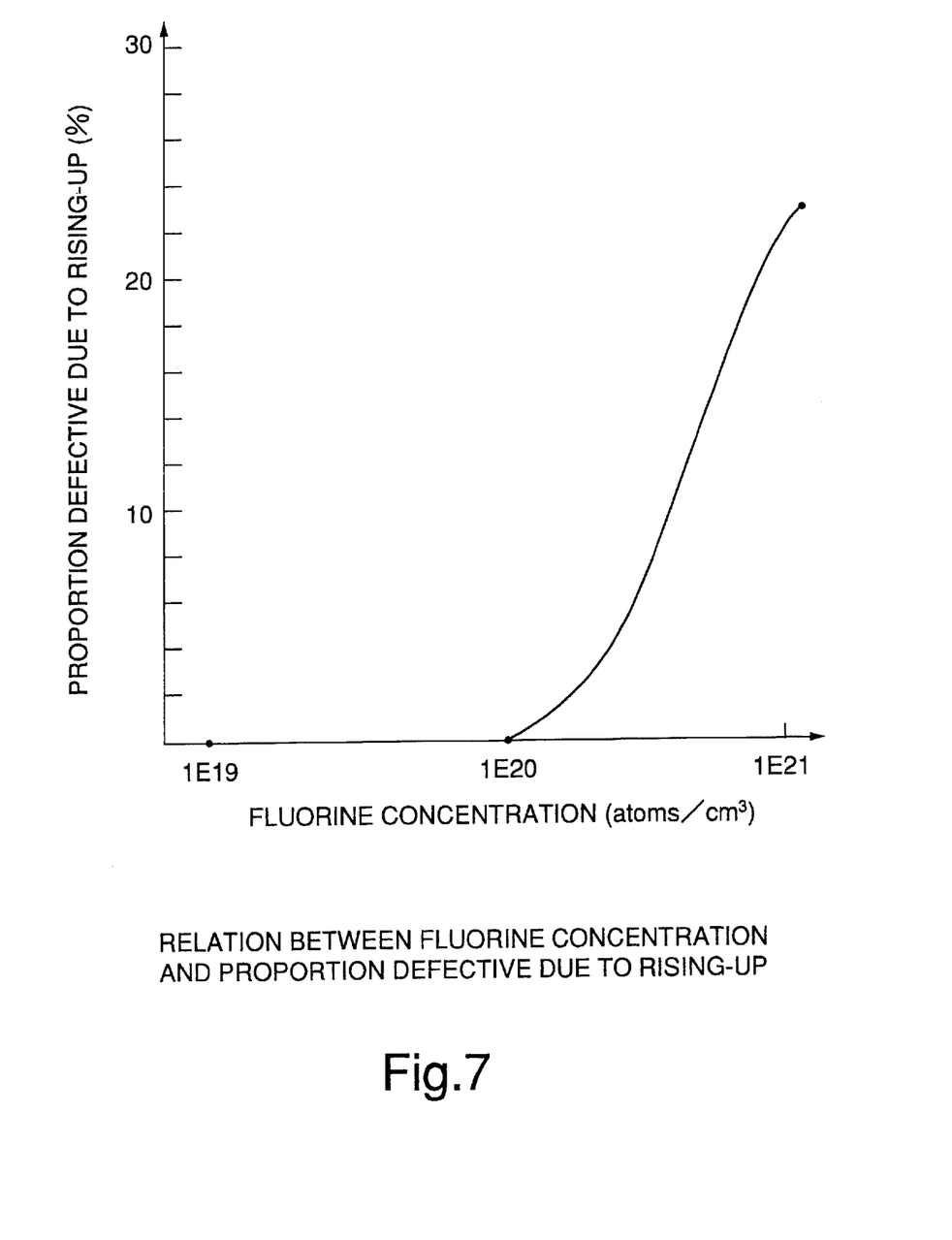
FIG. 7 shows a relation between a yield ratio and the fluorine concentration obtained when the first embodiment is performed.

The Ti silicide film 13 formed as described above exhibits no rising-up onto the field oxide film 2 and the side wall 5. The low sheet resistivity of the Ti silicide film of 10 Ω/☐ or less can be obtained, so that an increase in an operation speed of the devices can be achieved and the yield ratio of the good quality products increases as shown in FIG. 7.

The second embodiment is also described with reference to FIGS. 1(a) to 1(h).

First, as shown in FIG. 1(a), similar to the first embodiment, the field oxide film 2, the gate oxide film 3, the gate electrode 4 and the side wall film 5 are formed on the silicon substrate 1.

Subsequently, a protection oxide film 7 for an ion injection is formed on the entire surface of the resultant structure using a CVD method. Thereafter, the impurity ions 8 are injected into the exposed portions of the silicon substrate 6, thereby forming the diffusion layer 9 (FIG. 1(b)). Here, similar to the first embodiment, a description is made for formation of a P-type diffusion layer. As P-type impurities, $BF^{2+}$ (mass: 49) ions capable of forming a shallow junction are injected into the entire surface of the resultant structure of FIG. 1(a), under the conditions that an acceleration voltage is 30 KeV and an impurity concentration is 3E15 $cm^{-2}$. At this time, the depth profile of concentrations of boron and fluorine that are component elements of the ion injection species is determined depending on injection energy, in which B exhibits the maximum concentration near about 30 nm and F exhibits it near about 25 nm, as shown in FIG. 6.

Figure 2:
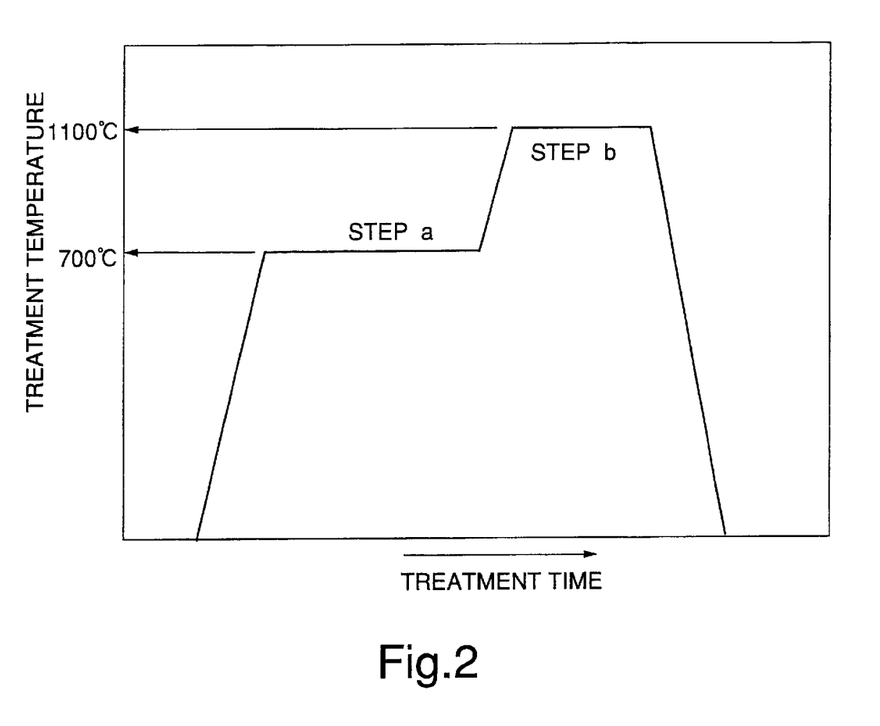
FIG. 2 shows a temperature profile when a low temperature thermal treatment and an activation thermal treatment are consecutively performed in the second embodiment of the present invention.

Subsequently, a thermal treatment at a temperature of 1000° C. for 10 seconds is performed for activating the impurity ions using a lamp annealing apparatus. As shown in FIG. 2, the temperature is changed. In step a of FIG. 2, fluorine is discharged as out-gas from the field oxide film 2, the side wall film 5, the silicon substrate 1 and the interface between the silicon substrate 1 and the field oxide film 2 (FIG. 1(c)). Hence, the F concentrations in the field oxide film 2, the side wall film 5, the silicon substrate 1 and the interface between the silicon substrate 1 and the field oxide film 2 become 1E20 atom/$cm^3$ or less. In step b of FIG. 2, the activation of the impurity ions is performed. That is, the activated diffusion layer 14 is formed. Thus, it is unnecessary to increase the number of the steps and manufacturing apparatuses.

Next, the protection oxide film 7 is removed using a RIE etching apparatus (FIG. 1(d)). Thereafter, natural oxide films formed on the diffusion layer and the gate electrode are removed using 1:100 DHF liquid, prior to a Ti sputtering.

Subsequently, as shown in FIG. 1(e), the Ti film 11 is formed to a thickness of 30 nm on the entire surface of the resultant structure by sputtering. A thermal treatment at a temperature of 700° C. for 30 seconds is performed using a lamp annealing apparatus, thereby forming the Ti silicide layer 12 of C49 phase formed of high resistance $TiSi_2$ (a first sinter) (FIG. 1(f)). At this time, the Ti silicide layer 12 is formed only on the gate electrode 3 and the diffusion layer 9 in a self-aligned manner.

Then, the non-reactive portions of the Ti film 11 on the field oxide film 2 and the side wall film 5 are removed using an ammonium hydroxide peroxide mixture (FIG. 1(g)).

Thereafter, a thermal treatment at a temperature of 850° C. for 10 seconds is further performed using a lamp annealing apparatus. As a result, the Ti silicide layer 13 of C54 phase formed of low resistance $TiSi_2$ as shown in FIG. 1(h) is formed (a second sinter).

The Ti silicide film 13 formed as described above exhibits no rising-up onto the field oxide film 2 and the side wall 5. The low sheet resistivity of the Ti silicide film of 10 Ω/☐ or less can be obtained, so that an increase in an operation speed of the devices can be achieved.

The Ti silicide formed using the present invention reduces the fluorine concentrations in the field oxide film and the side wall oxide film, whereby the rising-up of the Ti silicide can be suppressed and good quality products can be stably obtained without electrical short-circuits between the gate electrode and the diffusion layer as well as between the diffusion layers adjacent to each other.

Although the preferred embodiments of the present invention have been described in detail, it should be understood that various changes, substitutions and alterations can be made therein without departing from the spirit and scope of the invention as defined by the appended claims.

What is claimed is:

1. A method for fabricating a semiconductor device, comprising:

forming an element insulating layer on a substrate;

forming a gate insulating layer on the substrate;

forming a gate electrode on the gate insulating layer;

forming a sidewall on a side of the gate electrode;

injecting an ion injection species into the substrate using the gate electrode as a mask;

heat-treating the element insulating layer to decrease a fluorine concentration in the element insulating layer to a level less than $1 \times 10^{20}$ atoms/cm$^2$;

forming a metal layer on the gate electrode; and heat-treating the metal layer and the gate electrode to form a metal silicide on the gate electrode, wherein said heat-treating the element insulating layer step is performed before said forming a metal layer step.

2. The method of claim 1, wherein said injecting an ion injection species step includes injecting fluorine and boron.

3. The method of claim 1, wherein said injecting an ion injection species step includes injecting BF$_2$.

4. The method of claim 1, wherein said heat-treating the element insulating layer step is performed at a temperature of 700° C.

5. The method of claim 1, further comprising heat-treating the semiconductor substrate and activating the ion injection species at a temperature higher than a temperature of said heat-treating the element insulating layer step, wherein said heat-treating the semiconductor substrate step is performed after said heat-treating the element insulating layer step.

6. The method as claimed in claim 1, wherein said forming a metal layer step includes forming a titanium layer on the gate electrode.

7. A method of fabricating a semiconductor device, comprising:

forming an element insulation layer on a substrate;

forming a gate insulating layer on the substrate;

forming a gate electrode on the gate insulating layer;

forming a sidewall on a side of the gate electrode;

injecting an ion injection species into the substrate using the gate electrode as a mask;

heat-treating the element insulation layer at a temperature which discharges fluorine in the element insulation layer without reacting the fluorine and silicon in the element insulation layer;

forming a metal layer on the gate electrode; and heat-treating the metal layer and the gate electrode to form a metal silicide on the gate electrode, wherein said heat-treating the element insulation layer step is performed before said forming a metal layer step.

8. The method of claim 7, wherein said injecting an ion injection species step includes injecting fluorine and boron.

9. The method of claim 7, wherein said injecting an ion injection species step includes injecting BF$_2$.

10. The method of claim 7, wherein said heat-treating the element insulation layer step is at a temperature of 700° C.

11. The method of claim 7, wherein said heat-treating the element insulation layer step reduces a density of the fluorine in the element insulation layer to less than $1 \times 10^{20}$ atoms/cm$^2$.

12. The method of claim 7, further comprising heat-treating the semiconductor substrate to activate the ion injection species at a temperature higher than a temperature of said heat-treating the element insulation layer step.

13. The method as claimed in claim 7, wherein said forming a metal layer step includes forming a titanium layer on the gate electrode.

14. A method for fabricating a semiconductor device, comprising:

forming an element insulation layer;

forming a gate insulating layer on a substrate;

forming a gate electrode on the gate insulating layer;

forming a sidewall on a side of the gate electrode;

forming a surface insulating layer over an entire surface of the substrate;

injecting an ion injection species into the substrate using the gate electrode as a mask;

heat-treating the element insulation layer at a temperature which decreases a fluorine concentration in the element insulation layer;

removing the surface insulating layer;

forming a metal layer on the gate electrode; and heat-treating the metal layer and the gate electrode to form a metal silicide on the gate electrode.

15. The method of claim 14, wherein said injecting an ion injection species step includes injecting fluorine and boron.

16. The method of claim 14, wherein said injecting an ion injection species step includes injecting BF$_2$.

17. The method of claim 14, wherein said heat-treating the element insulating layer step is at a temperature of 700° C.

18. The method of claim 14, wherein said heat-treating the element insulating layer step decreases the fluorine concentration in the element insulating layer to a level less than $1 \times 10^{20}$ atoms/cm$^2$.

19. The method of claim 14, further comprising activating the ion injection species by heat-treating the semiconductor substrate at a temperature higher than a temperature of said heat-treating the element insulating layer step, wherein said activating step is performed after said heat-treating the element insulating layer step.

20. The method as claimed in claim 14, wherein said forming a metal layer step includes forming a titanium layer on the gate electrode.

21. The method as claimed in claim 14, wherein said heat-treating the element insulating layer step is performed at a temperature which discharges fluorine in the element insulating layer without reacting the fluorine and silicon in the semiconductor device.

* * * * *

(12) EX PARTE REEXAMINATION CERTIFICATE (7123rd)
United States Patent
Yamamoto (10) Number: US 6,133,122 C1
(45) Certificate Issued: *Oct. 27, 2009

(54) METHOD OF FABRICATING SEMICONDUCTOR DEVICE FOR PREVENTING RISING-UP OF SILISIDE

(75) Inventor: Yoshiaki Yamamoto, Tokyo (JP)

(73) Assignee: NEC Electronics Corporation, Nakahara-Ku, Kawasaki, Kanagawa (JP)

Reexamination Request:
No. 90/008,912, Nov. 5, 2007

Reexamination Certificate for:
Patent No.: 6,133,122
Issued: Oct. 17, 2000
Appl. No.: 09/089,666
Filed: Jun. 3, 1998

( * ) Notice: This patent is subject to a terminal disclaimer.

(30) Foreign Application Priority Data

Jun. 6, 1997 (JP) ............................................ 9-149733

(51) Int. Cl.
*H01L 21/336* (2006.01)
*H01L 21/02* (2006.01)
*H01L 21/265* (2006.01)
*H01L 21/324* (2006.01)

(52) U.S. Cl. .................. 438/514; 438/303; 438/305; 438/522; 438/533; 438/585; 438/648; 257/E21.337; 257/E21.324; 257/E21.438

(58) Field of Classification Search .................. None
See application file for complete search history.

(56) References Cited

U.S. PATENT DOCUMENTS

| 5,471,085 A | 11/1995 | Ishigaki et al. |
| 5,880,500 A | 3/1999 | Iwata et al. |
| 5,888,875 A | 3/1999 | Lasky |
| 6,124,190 A | 9/2000 | Yamamoto et al. |
| 6,133,122 A | 10/2000 | Yamamoto |

FOREIGN PATENT DOCUMENTS

| JP | 07-249763 | 9/1995 |
| JP | 07-273121 | 10/1995 |
| JP | 09023003 A * | 1/1997 |

* cited by examiner

*Primary Examiner*—Erik Kielin (57) ABSTRACT

Disclosed is a manufacturing method of a semiconductor device which comprises which comprises an element isolation region formation step; a side wall formation step; a diffusion layer formation step; an activiation step; a silicide formation step; and a removing step. The element isolation region formation step is the one for forming a field oxide film on a semiconductor substrate to form an element isolation region. In order to form a diffusion layer by introducing impurities into the semiconductor substrate, after injecting the fluorides (ion injection species) of elements into the semiconductor substrate, a thermal treatment is performed at a lower temperature than that of a thermal treatment for activating the diffusion layer prior to the activation of the diffusion layer, and fluorine produced from the ion injection species is discharged to the outside.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–3, 6, 8, 9, 12, 13, 15–17 and 20 are cancelled.

Claims 4, 5, 7 and 14 are determined to be patentable as amended.

Claims 10, 11, 18, 19 and 21, dependent on an amended claim, are determined to be patentable.

4. [The] *A* method [of claim 1,] *for fabricating a semiconductor device, comprising:*

*forming an element insulating layer on a substrate;*
   *forming a gate insulating layer on the substrate;*
   *forming a gate electrode on the gate insulating layer;*
   *forming a sidewall on a side of the gate electrode;*
   *injecting an ion injection species including fluorine, into the substrate using the gate electrode as a mask;*
   *heat-treating the element insulating layer to decrease a fluorine concentration in the element insulating layer to a level less than $1 \times 10^{20}$ atoms/cm$^2$;*
   *forming a metal layer on the gate electrode; and*
   *heat-treating the metal layer and the gate electrode to form a metal silicide on the gate electrode,*
   *wherein said heat-treating the element insulating layer step is performed before said forming a metal layer step, and*
   wherein said heat-treating the element insulating layer step is performed at a temperature of 700° C.

5. [The] *A* method [of claim 1,] *for fabricating a semiconductor device, comprising:*

*forming an element insulating layer on a substrate;*
   *forming a gate insulating layer on the substrate;*
   *forming a gate electrode on the gate insulating layer;*
   *forming a sidewall on a side of the gate electrode;*
   *injecting an ion injection species including fluorine, into the substrate using the gate electrode as a mask;*
   *heat-treating the element insulating layer to decrease a fluorine concentration in the element insulating layer to a level less than $1 \times 10^{20}$ atoms/cm$^2$;*
   *forming a metal layer on the gate electrode; and*
   *heat-treating the metal layer and the gate electrode to form a metal silicide on the gate electrode, and*
   *wherein said heat-treating the element insulating layer step is performed before said forming a metal layer step,*
   *said method* further comprising heat-treating the semiconductor substrate and activating the ion injection species at a temperature higher than a temperature of said heat-treating the element insulating layer step,
   wherein said heat-treating the semiconductor substrate step is performed after said heat-treating the element insulating layer step.

7. A method of fabricating a semiconductor device, comprising:

forming an element insulation layer on a substrate;
   forming a gate insulating layer on the substrate;
   forming a gate electrode on the gate insulating layer;
   forming a sidewall on a side of the gate electrode;
   injecting an ion injection species into the substrate using the gate electrode as a mask;
   heat-treating the element insulation layer at a temperature which discharges fluorine in the element insulation layer without reacting the fluorine and silicon in the element insulation layer;
   *heat-treating the semiconductor substrate to activate the ion injection species at a temperature higher than a temperature of said heat-treating the element insulation layer step;*
   forming a metal layer on the gate electrode; and
   heat-treating the metal layer and the gate electrode to form a metal silicide on the gate electrode,
   wherein said heat-treating the element insulation layer step is performed before said forming a metal layer step.

14. A method for fabricating a semiconductor device, comprising:

forming an element insulation layer;
   forming a gate insulating layer on a substrate;
   forming a gate electrode on the gate insulating layer;
   forming a sidewall on a side of the gate electrode;
   forming a surface insulating layer over an entire surface of the substrate;
   injecting an ion injection species *including fluorine,* into the substrate using the gate electrode as a mask;
   heat-treating the element insulation layer at [a temperature] *700° C.* which decreases a fluorine concentration in the element insulation layer;
   removing the surface insulating layer;
   forming a metal layer on the gate electrode; and
   heat-treating the metal layer and the gate electrode to form a metal silicide on the gate electrode.

* * * * *